(12) United States Patent
Wang

(10) Patent No.: US 6,204,089 B1
(45) Date of Patent: *Mar. 20, 2001

(54) METHOD FOR FORMING FLIP CHIP PACKAGE UTILIZING CONE SHAPED BUMPS

(75) Inventor: Tsung-Hsiung Wang, Taichung (TW)

(73) Assignee: Industrial Technology Research Institute, Hsin Chu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/312,288

(22) Filed: May 14, 1999

(51) Int. Cl.$^7$ .................................................. H01L 21/44
(52) U.S. Cl. ............................................................ 438/108
(58) Field of Search ....................... 228/180.22; 438/108, 438/109, 118, 119, 612, 613, 614, 106, 597, 617; 29/840, 841

(56) References Cited

U.S. PATENT DOCUMENTS

| | | | | |
|---|---|---|---|---|
| 5,376,584 | * | 12/1994 | Agarwala | 438/614 |
| 5,468,655 | * | 11/1995 | Greer | 438/15 |
| 5,478,007 | * | 12/1995 | Marrs | 228/180.22 |
| 5,795,818 | * | 8/1998 | Marrs | 438/612 |
| 5,854,514 | * | 12/1998 | Roldan et al. | 257/746 |
| 5,874,780 | * | 2/1999 | Murakami | 257/775 |
| 5,894,173 | * | 4/1999 | Jacobs et al. | 257/790 |
| 5,916,407 | * | 6/1999 | Gruenwald et al. | 156/291 |
| 6,005,292 | * | 12/1999 | Roldan et al. | 257/777 |

FOREIGN PATENT DOCUMENTS

| | | | |
|---|---|---|---|
| 57-143838 | * | 9/1982 | (JP). |
| 2-189926 | * | 7/1990 | (JP). |

* cited by examiner

*Primary Examiner*—Olik Chaudhuri
*Assistant Examiner*—Alonzo Chambliss
(74) *Attorney, Agent, or Firm*—Tung & Associates

(57) ABSTRACT

A method for forming a flip chip package by using cone-shaped solder bumps and a package formed by such method are disclosed. In the method, an integrated circuit chip is first provided with a plurality of cone-shaped solder bumps formed on a plurality of bond pads. The cone-shaped solder bumps are equipped with sharp-pointed tip portions such that they penetrate an electrically insulating material layer that is positioned between the solder bumps on the IC chip and a substrate to be bonded thereto. When a lamination process is conducted on the IC chip and the substrate with the electrically insulating material layer therebetween, electrical communication between the plurality of bond pads and a plurality of conductive elements on the surface of the substrate is established when the cone-shaped solder bumps penetrate the electrically insulating material layer and form ohmic contact with the conductive elements on the substrate. The present invention novel method therefore eliminates many processing steps that are required in a conventional flip chip bonding process and provides an improved method that saves both costs and time.

14 Claims, 3 Drawing Sheets

METHOD FOR FORMING FLIP CHIP PACKAGE UTILIZING CONE SHAPED BUMPS

FIELD OF THE INVENTION

The present invention generally relates to a method for forming a flip chip package and a package formed and more particularly, relates to a method for forming a flip chip package by using cone-shaped solder bumps on the flip chip and an electrically insulating material layer in-between the flip chip and a substrate such that the cone-shaped solder bumps penetrate the electrically insulating material layer establishing electrical communication with conductive elements on the substrate and a package fabricated by such method.

BACKGROUND OF THE INVENTION

In the fabrication of modern semiconductor devices, the ever increasing device density and decreasing device dimensions demand more stringent requirements in the packaging or interconnecting techniques of such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become impractical for several reasons. One of the problems in utilizing solder paste screening technique in bonding modern semiconductor devices is the paste composition itself. A solder paste is formed by a flux material and solder alloy particles. The consistency and uniformity of the solder paste composition become more difficult to control as the solder bump volume decreases. Even though a solution of the problem has been proposed by using solder paste that contain extremely small and uniform solder particles, it can only be achieved at a high cost penalty. A second problem in utilizing the solder paste screening technique in modern high density semiconductor devices is the available space between solder bumps. It is known that a large volume reduction occurs when a solder changes from a paste state to a cured stated, the screen holes for the solder paste must be significantly larger in diameter than the actual solder bumps to be formed. The large volume shrinkage ratio thus makes the solder paste screening technique difficult to carry out in high density devices.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique. For instance, a conventional thin film electrodeposition process for depositing solder bumps is shown in FIGS. 1A~1F.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Onto the top surface 24 of the passivation layer 20 and the exposed top surface 18 of the bond pad 14, is then deposited an under bump metallurgy layer 26. This is shown in FIG. 1B. The under bump metallurgy (UBM) layer 26 normally consists of an adhesion diffusion barrier layer 30 and a wetting layer 28. The adhesion diffusion barrier layer 30 may be formed of Ti, TiW or other metal such as Cr. The wetting layer 28 is normally formed of a Cu layer or a Ni layer. The UMB layer 26 improves bonding between a solder ball to be formed and the top surface 18 of the bond pad 14.

In the next step of the process, as shown in FIG. 1C, a photoresist layer 34 is deposited on top of the UMB layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 $\mu$m and about 40 $\mu$m, preferably at a thickness of about 35 $\mu$m. The reason for the tight control on the thickness of the photoresist layer 34 is that, for achieving a fine-pitched solder bump formation, a photoresist layer of a reasonably small thickness must be used such that a high imaging resolution can be achieved. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 42. The reflow process is conducted at a temperature that is at least the reflow temperature of the solder material.

The conventional method for depositing solder bumps described above presents a number of processing difficulties. For instance, one of the difficulties is the large volume of solder used in a mushroom-shaped bump which impedes the process of making fine-pitched bumps. The other processing difficulties are the complexity of the method and the large number of processing steps required. For instance, FIG. 2 illustrates, on the left side of the figure, the processing steps required for a conventional flip chip bonding method. First, the IC chip is prepared by forming aluminum bond pad on the chip, followed by an under-bump-metallurgy (UBM) process for preparing bonding sites for solder bumps, and then the solder bumping or bump forming process by electrodeposition, electroless deposition, etc. The substrate must also be prepared by coating a flux coating layer on top of the conductive elements that the solder bumps are bonded to. The flip chip bonding process is then carried out by pressing the solder bumps on the IC chip against the conductive elements on the substrate together forming bonds, the solder bumps are then reflown to ensure ohmic contacts are established between the solder bump and the conductive elements. The solder bumps on the IC chip may optionally be coated with a flux coating layer by a fluxer (or a doctor plane). A flux cleaning step is then required to remove the excess flux coating on the substrate followed by a drying step for removing the cleaning solvent. In the final steps of the flip chip bonding process, an underfill material is used to fill the gaps between the IC chip and the substrate for passivation and for relieving thermal stresses, followed by a curing or annealing process for the underfill layer. As shown in FIG. 2, there are at least ten major processing steps required in the conventional flip chip bonding method to complete a flip chip package.

It is therefore an object of the present invention to provide a method for forming a flip chip package that does not have the drawbacks or shortcomings of the conventional methods.

It is another object of the present invention to provide a method for forming a flip chip package by utilizing cone-shaped solder bumps formed on an IC chip.

It is a further object of the present invention to provide a method for forming a flip chip package by using cone-shaped solder bumps that are equipped with sharp-pointed tip portions for penetrating an electrically insulating material layer positioned in-between the IC chip and a substrate.

It is another further object of the present invention to provide a method for forming a flip chip package by utilizing cone-shaped solder bumps formed on an IC chip of a solder material such as Sn/Pb, Sn/Zn or Sn/Ag.

It is still another object of the present invention to provide a method for forming a flip chip package by utilizing cone-shaped solder bumps provided on an IC chip and heating an electrically insulating material layer positioned in-between the IC chip and a substrate to a temperature of at least 150° C. for bonding the solder bumps to the conductive elements on the substrate.

It is yet another object of the present invention to provide a method for forming a flip chip package by using cone-shaped solder bumps on an IC chip and a dielectric material layer having a thickness between about 10 μm and about 250 μm between the IC chip and a substrate wherein the solder bumps penetrate the dielectric material layer establishing electrical communication with conductive elements on the substrate.

It is still another fierier object of the present invention to provide a flip chip package formed by cone-shaped solder bumps that are equipped with sharp-pointed tip portions and an electrically insulating material layer between an IC chip and a substrate.

It is yet another further object of the present invention to provide a flip chip package that utilizes an electrically insulating material layer between an IC chip and a substrate wherein the layer is a laminate with a dielectric core layer sandwiched between two layers of electrically insulating adhesive material.

SUMMARY OF THE INVENTION

In accordance with the present invention, a method for forming a flip chip package by using cone-shaped solder bumps and a flip chip package fabricated by such methods are provided.

In a preferred embodiment, a method for forming a flip chip package by using cone-shaped solder bumps can be carried out by the steps of first providing an integrated circuit chip equipped with a first plurality of bond pads on an active surface, building a first plurality of cone-shaped bumps on the first plurality of bond pads, providing a substrate that has a second plurality of conductive elements formed on a top surface, positioning an electrically insulating material layer on the top surface of the substrate, and compressing the IC chip and the substrate together with the electrically insulating material layer therein between at a temperature of at least 150° C. such that electrical communication is established between the first plurality of bond pads and the second plurality of conductive elements when the first plurality of cone-shaped bumps penetrates the electrically insulating material layer and contacts the second plurality of conductive elements.

The method for forming a flip chip package by cone-shaped solder bumps further include the step of providing the first plurality of cone-shaped solder bumps with sharp-pointed tip portions, or the step of forming the first plurality of cone-shaped solder bumps in a solder material of Sn/Pb, Sn/Zn or Sn/Ag. The method may further include the step of providing the electrically insulating material layer in a dielectric material. The method may further include the step of building the first plurality of cone-shaped bumps by a technique such as injection molding, screen printing, stencil printing or transfer molding. The method may further include the step of building the first plurality of cone-shaped bumps by first filling bump cavities in a mold plate with a solder material and then transferring molded solder bumps onto the IC chip. The method may further include the step of providing a substrate that has a second plurality of conductive traces formed on a top surface. The method may further include the step of providing the electrically insulating material layer in a thickness between about 10 μm and about 250 μm, or the step of providing the electrically insulating material layer in a polymeric-based adhesive, or an adhesive material that is electrically insulative.

The method for forming a flip chip package by cone-shaped solder bumps may further include the step of providing the electrically insulating material layer in a laminate that has an electrically insulating core material sandwiched between two layers of electrically insulating adhesive material, the electrically insulating core material may be a liquid crystal polymer, a polyimide, an epoxy or a polyaramid, while the electrically insulating adhesive material may be selected from the group consisting of epoxy, polyimide or polyester. The method may further include the step of compressing the IC chip and the substrate together at a temperature between about 150° C. and about 300° C., or at a pressure between about 50 psi and about 200 psi.

The present invention is further directed to a flip chip package that is formed by cone-shaped solder bumps which includes an IC chip that is equipped with a first plurality of bond pads on an active surface and a first plurality of cone-shaped bumps on the bond pads, a substrate that has a second plurality of conductive elements on a top surface, and an electrically insulating material layer bonding the IC chip and the substrate together wherein the first plurality of cone-shaped bumps penetrates the electrically insulating material layer such that the first plurality of bond pads is in electrical communication with the second plurality of conductive elements through the cone-shaped bumps.

In the flip chip package that is formed by cone-shaped solder bumps, the IC chip is a flip chip and the substrate is a printed circuit board or a liquid crystal display substrate. The electrically insulating material layer may be formed of a dielectric material, such as a polymeric-based adhesive material. The electrically insulating material layer may be a laminate with an electrically insulating core layer sandwiched between two layers of electrically insulating adhesive material, wherein the core layer may be formed of a liquid crystal polymer, a polyimide, an epoxy or a polyaramid, and the electrically insulating adhesive material may be formed of an epoxy, a polyimide or a polyester. The electrically insulating material layer may be formed of a thickness of between about 10 $\mu$m and about 250 $\mu$m, and may have a glass transition temperature between about 150° C. and about 300° C. The second plurality of conductive elements provided on the substrate may be conductive traces formed of an electrically conductive metal.

BRIEF DESCRIPTION OF THE DRAWINGS

These objects, features and advantages will become apparent from a close examination of the following specification and the appended drawings in which.

DETAILED DESCRIPTION OF THE PREFERRED AND ALTERNATE EMBODIMENTS

The present invention discloses a method for forming a flip chip package by using cone-shaped solder bumps provided on an active surface of an IC chip and a dielectric material layer or an adhesive material layer between the IC chip and a substrate for forming the flip chip package.

In the method, a plurality of cone-shaped solder bumps equipped with sharp-pointed tip portions are first formed on an active surface of an IC chip. The formation of such cone-shaped solder bumps may be carried out by either directly on a plurality of bond pads on the IC chip or by a transfer molding process. In the direct forming process, techniques such as electrodeposition, electroless deposition, screen printing or stencil printing may be utilized depending on the size of to the bumps and the distance between the bumps, or the pitch. The solder bumps may be suitably formed by a solder material that contains Sn and/or Pb, for instance, Sn/Pb, Sn/Zn or Sn/Ag. The solder material should have a melting temperature that is somewhat, i.e. between about 10° C. and about 50° C. higher than the glass transition temperature of the dielectric material layer used in-between the IC pad and the substrate bonded.

The cone-shaped solder bumps may further be formed by a transfer molding process in which the bumps are first formed in a mold plate which is made of a material that has a similar coefficient of thermal expansion as that of silicon. The similar CTE of the mold material enables the solder bumps to be formed at locations that exactly correspond to the locations of bond pads on a silicon wafer such that positioning of the bumps on the silicon substrate can be accurately performed. In the transfer molding process, the mold plate is first provided by either mechanical means or by photo-chemical means such as etching for forming a multiplicity of cavities in the mold surface that enable solder bumps of the exact shape to be formed. When the cone-shaped solder bumps are equipped with sharp-pointed tip portions, a vacuum passageway should be provided in each cavity or alternatively, the cavities should be withdrawn with vacuum prior to the mold filling process such that the mold cavities can be completely filled with a molten solder. The direct-on-bond-pad forming process of the solder bumps is more preferred since it eliminates the intermediate step of forming the bumps first in a mold plate.

Figure 1A:
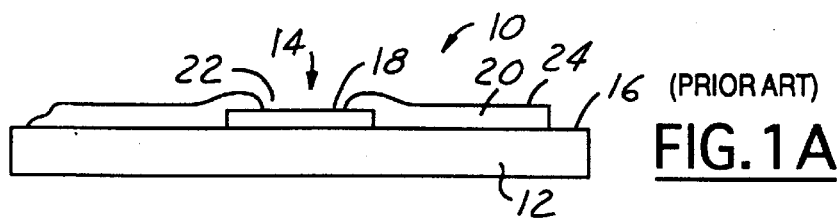
FIG. 1A is an enlarged, cross-sectional view of a conventional pre-processed substrate which has a bond pad and a passivation layer formed on top.
Figure 1B:
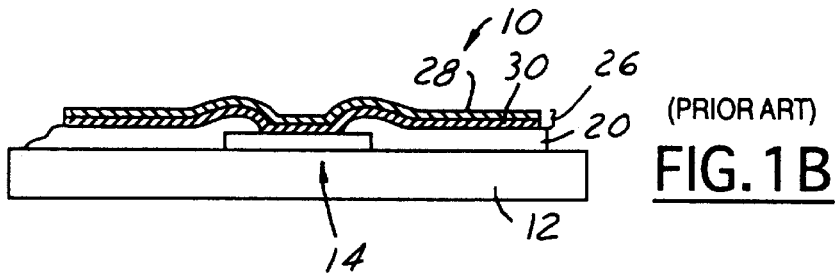
FIG. 1B is an enlarged, cross-sectional view of the conventional semiconductor structure of FIG. 1A with an under-bump-metallurgy layer formed on top.
Figure 1C:
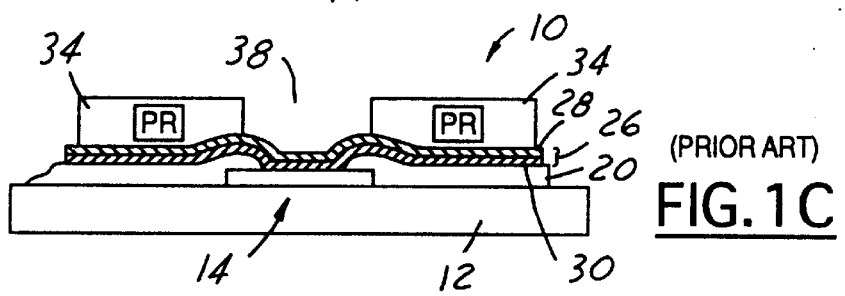
FIG. 1C is an enlarged, cross-sectional view of the conventional semiconductor structure of FIG. 1B with a photoresist layer deposited and defined on top.
Figure 1D:
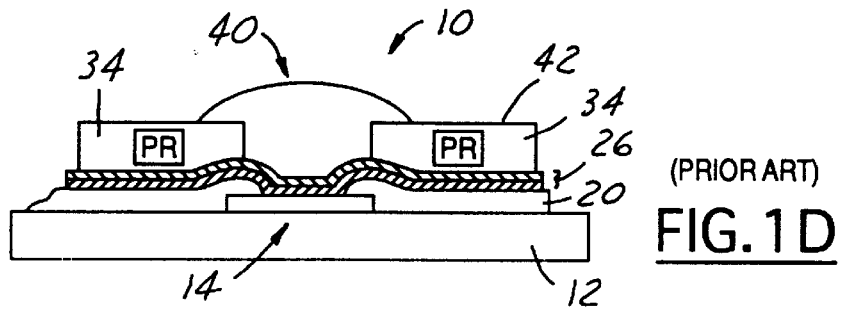
FIG. 1D is an enlarged, cross-sectional view of the conventional semiconductor structure of FIG. 1C with a solder material deposited into the window for the solder bump.
Figure 1E:
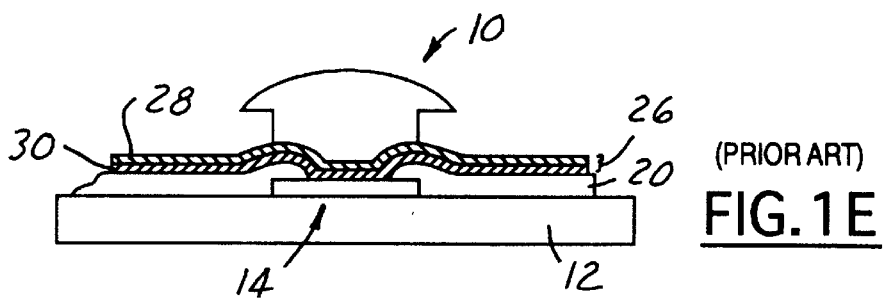
FIG. 1E is an enlarged, cross-sectional view of the conventional semiconductor structure of FIG. 1D with the photoresist layer removed in a wet etching process.
Figure 1F:
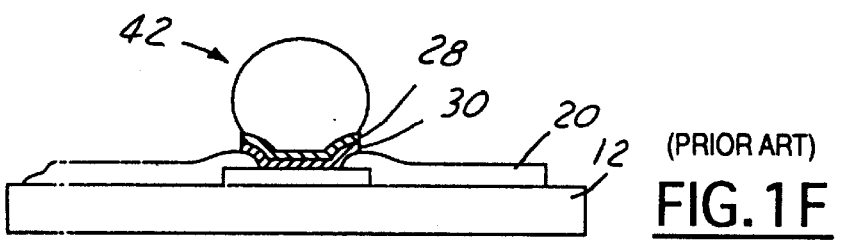
FIG. 1F is an enlarged, cross-sectional view of the conventional semiconductor structure of FIG. 1E with the exposed under-bump-metallurgy layer removed and the solder bump reflown into a solder ball.
Figure 2:
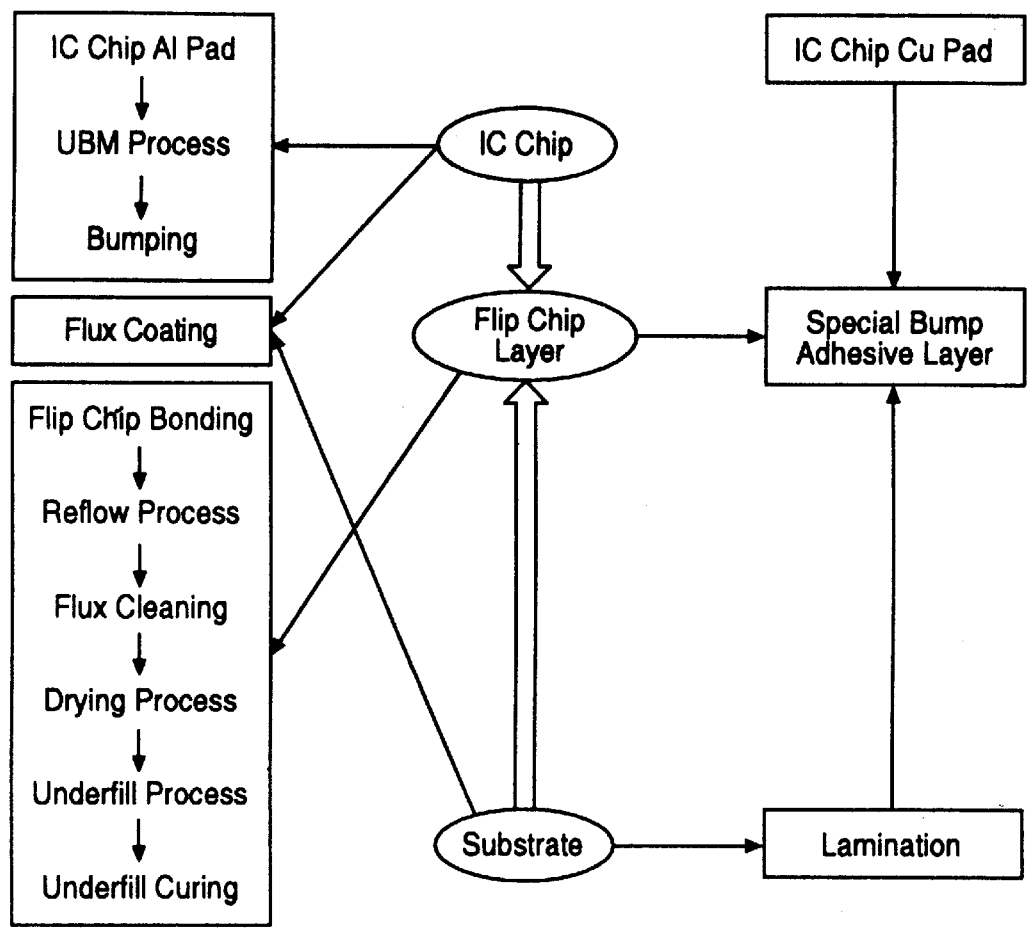
FIG. 2 is a schematic illustrating process flow charts for the conventional flip chip bonding method and the present invention flip chip bonding method.

The present invention novel method for forming a flip chip package by using cone-shaped solder bumps is shown on the right side of FIG. 2. When compared to the conventional flip chip package forming method shown on the left side of FIG. 2, it is seen that a greatly simplified process is provided by the present invention method. For instance, the three separate steps used in preparing an IC chip in the convention flip chip bonding method is reduced to a single step of providing copper bond pads on an active surface of the IC chip. The substrate that the IC chip is bonded to does not require a wetting or a flux coating layer on top for carrying out the present invention novel method. The flip chip bonding process, instead of requiring six separate steps as that shown in the conventional method, only two steps of providing cone-shaped solder bumps and an electrically insulating material layer, such as an adhesive layer in-between the IC chip and the substrate, are necessary.

Figure 3:
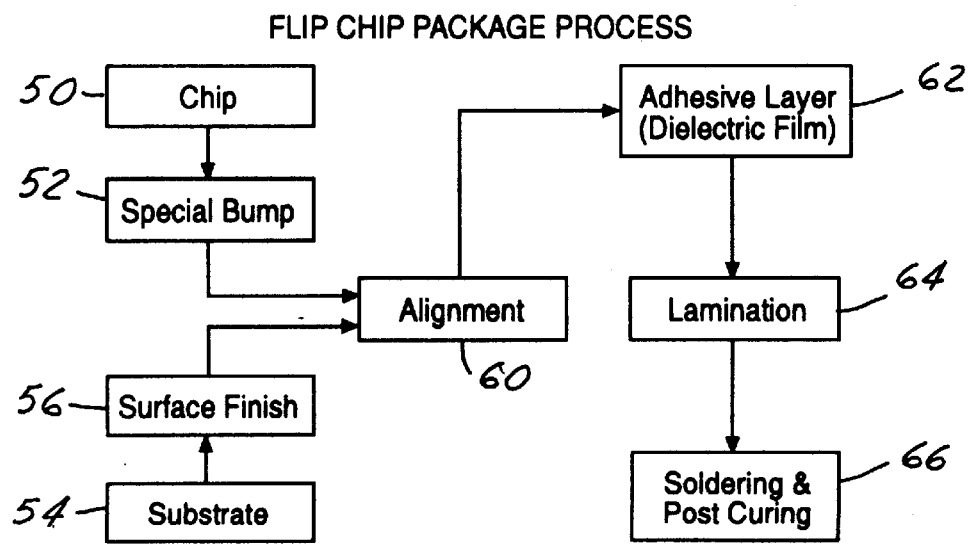
FIG. 3 is a schematic illustrating a detailed process flow chart for the present invention flip chip packaging process.

A more detailed process flow for the present invention novel method is shown in FIG. 3. In the first process step 50, an IC chip that has an active surface and a plurality of bond pads formed of copper or aluminum is first provided. In the next process step, shown as step 52 in FIG. 3, a special bump preparation process is conducted which can be a direct-on-pad bump forming process or a transfer molding process that were previously described. The other major component used in the bonding process, ie. the substrate 54 which may be suitably a printed circuit board, a liquid crystal display structure or any other substrates that has conductive elements, or conductive traces formed thereon. When conductive traces of solder material is utilized, a surface finish step 54 may be required for pre-treating the solder surface with a wetting layer such as that shown in step 56. The prepared substrate and the prepared IC chip are then positioned in a fixture that is capable of applying a compressive force thereon and for aligning the chip and the substrate such that the plurality of cone-shaped solder bumps are aligned with the plurality of conductive elements on the surface of the substrate. This is shown in step 60.

In-between the IC chip and the substrate, an adhesive layer, as shown in step 62, of a dielectric nature is positioned. A lamination process under a suitable pressure and a suitable temperature, such as shown in step 64, is then carried out. It has been found that when an adhesive layer, or an electrically insulating material layer having a thickness between about 15 mm and about 250 μm is utilized, the desirable lamination condition used may be a temperature between about 150° C. and about 300° C., and a pressure between about 50 psi and about 200 psi. In the last step 66 of the process, the solder bumps are reflown at an elevated temperature, such as a temperature of at least 180° C. and the solder connections between the bond pads and the conductive elements are post-cured to improve bond strength and relieve thermal stresses.

Figure 4:
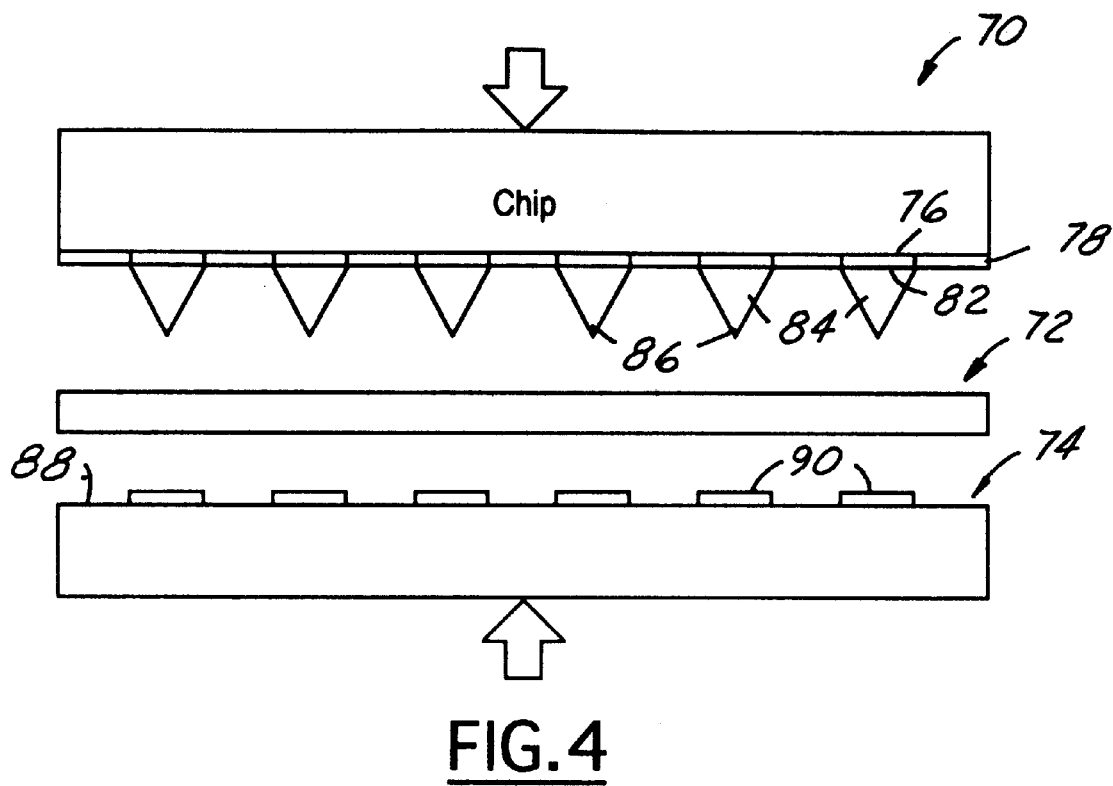
FIG. 4 is an enlarged, cross-sectional view of the major components used in the present invention method for flip chip bonding with cone-shaped solder bumps built on the IC chip.
Figure 5:
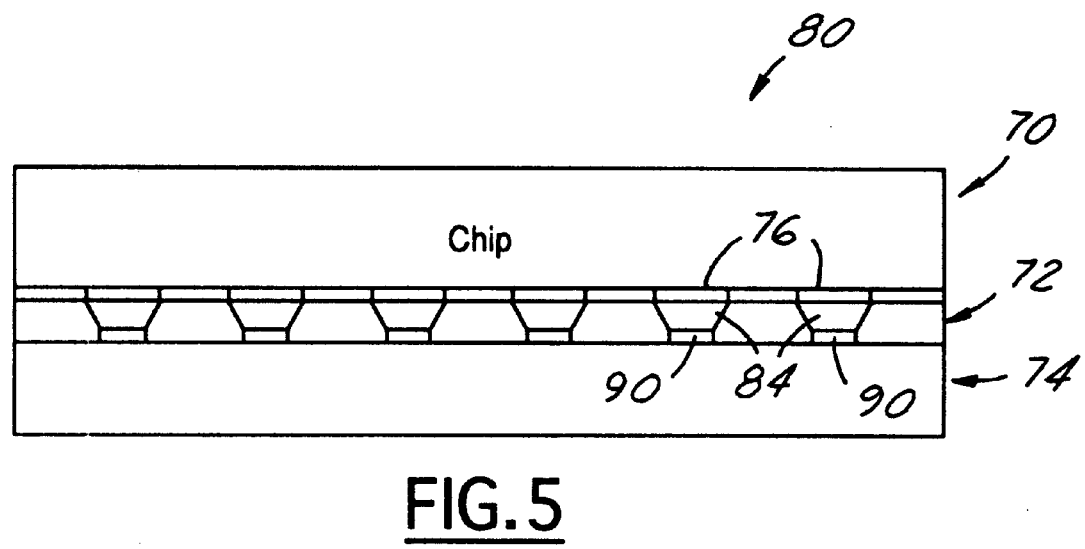
FIG. 5 is an enlarged, cross-sectional view of the components shown in FIG. 4 after they are bonded together by a compressive force.

FIGS. 4 and 5 are enlarged, cross-sectional view of the components utilized in the present invention novel bonding method and the flip chip package 80 formed after the novel process. As shown in FIG. 4, an IC chip 70, an electrically insulating material layer 72 suitably formed of a dielectric material or an adhesive material, and a substrate 74 are first provided and aligned in a compression fixture for applying a compressive force thereon. The IC chip 70 is first prepared with a first plurality of bond pads 76 that are embedded in a layer of passivation or insulating material 78. On the top surface 82 of the bond pads 76, are provided a plurality of cone-shaped solder bumps 84 which, as shown in FIG. 4, are equipped with sharp-pointed tip portions 86. The method for forming the cone-shaped solder bumps 84 have been previously described by either a direct-on-pad forming technique or by a transfer molding technique. A suitable material for forming the solder bumps includes lead or tin such as Sn/Pb, Sn//Zn or Sn/Ag. The height of the solder bumps formed should be at least 10% larger than the thickness of the electrically insulating material layer 72 utilized in the subsequent lamination process. It should further be noted that the melting temperature of the solder bump material utilized should be at least 10° C.~50° C. higher than the glass transition temperature of the electrically insulating material layer 72 such that, at a lamination temperature between about 150° C. and about 300° C., the electrically insulating material layer 72 softens first for easier penetration by the cone-shaped solder bumps 84.

The electrically insulating material layer 72 may be suitably provided in a dielectric material layer or in an adhesive material layer. Suitable materials for such use include liquid crystal polymers, polyimide, epoxy, polyaramid, etc. A suitable thickness for the electrically insulating material layer 72 may be between about 10 μm and about 250 μm, and preferably between about 15 μm and about 200 μm. The electrically insulating material may further be formed as a laminate with an electrically insulating core layer sandwiched between two layers of electrically insulating adhesive material. For instance, the electrically insulating core layer may be formed of a liquid crystal polymer, a polyimide, an epoxy or a polyaramid, while the electrically insulating adhesive material may be suitably selected of an epoxy, a polyimide or a polyester.

The substrate 74 provided for bonding to the IC chip 70 in the flip chip package may be suitably a printed circuit board, a liquid crystal display structure or any other suitable substrate. On a top surface 88 of the substrate 74, a second plurality of conductive elements 90 are provided. The conductive elements 90 may be in a form of conductive traces that are formed by an electrically conductive metal. The conductive elements 90 may further be provided in the form of bond pads on a printed circuit board.

In the lamination process, wherein a suitable lamination temperature used is between about 150° C. and about 300° C., and a suitable pressure used is between about 50 psi and about 200 psi in a reducing gas environment such as $H_2/N_2$, the flip chip package 80 is formed. This is shown in FIG. 5. It is seen that in the flip chip package 80, the sharp-pointed tip portions 86 of the cone-shaped solder bumps are eliminated due to the compressive force used in the bonding process and the heat which causes flow in the solder material. It should be noted that, as shown in FIG. 5, when the conductive elements 90 are formed of the same material as the solder bumps 84, the bonded joint may become an unitary structure instead of that shown in FIG. 5. The electrically insulating material layer 72 replaces the underfill material layer that is used in a conventional flip chip packaging process. By utilizing the present invention novel method, no additional process for dispensing the underfill material layer and for annealing or post-curing the underfill material layer is necessary.

The present invention novel method for forming a flip chip package by using cone-shaped solder bumps and flip chip packages formed by such method are therefore amply described in the above descriptions and in the appended drawings of FIGS. 2~5.

While the present invention has been described in terms of a preferred embodiment only, it is to be appreciated that those skilled in the art will readily apply these teachings to other possible variation of the invention.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for forming a flip chip package by cone-shaped solder bumps comprising the steps of:
   providing an integrated circuit (IC) chip equipped with a first plurality of bond pads on an active surface;
   building a first plurality of cone-shaped bumps on said first plurality of bond pads, wherein said first plurality of cone-shaped bumps does not have a spherically formed top surface;
   providing a substrate having a second plurality of conductive elements formed on a top surface;
   positioning an electrically insulating material layer having a thickness on said top surface of the substrate, wherein said electrically insulating material layer is not equipped with via holes;

compressing said IC chip and said substrate together with said electrically insulating material layer thereinbetween at a temperature of at least 150° C.; and penetrating through the thickness of said electrically insulating material layer by said first plurality of cone-shaped bumps to establish electrical communication between said first plurality of bond pads and said second plurality of conductive elements.

2. A method for forming a flip chip package by cone-shaped solder bumps according to claim 1 further comprising the step of providing said first plurality of cone-shaped solder bumps with sharp-pointed tip portions.

3. A method for forming a flip chip package by cone-shaped solder bumps according to claim 1 further comprising the step of forming said first plurality of cone-shaped solder bumps in a solder material selected from the group consisting of Sn/Pb, Sn/Zn and Sn/Ag.

4. A method for forming a flip chip package by cone-shaped solder bumps according to claim 1 further comprising the step of providing said electrically insulating material layer in a dielectric material.

5. A method for forming a flip chip package by cone-shaped solder bumps according to claim 1 further comprising the step of building said first plurality of cone-shaped bumps by a technique selected from the group consisting of injection molding, screen printing, stencil imprinting and transfer molding.

6. A method for forming a flip chip package by cone-shaped solder bumps according to claim 1 further comprising the step of building said first plurality of cone-shaped bumps by first filling bump cavities in a mold plate with a solder material and then transferring molded solder bumps onto said IC chip.

7. A method for forming a flip chip package by cone-shaped solder bumps according to claim 1 further comprising the step of providing a substrate having a second plurality of conductive traces formed on a top surface.

8. A method for forming a flip chip package by cone-shaped solder bumps according to claim 1 further comprising the step of providing said electrically insulating material layer in a thickness between about 10 μm and about 250 μm.

9. A method for forming a flip chip package by cone-shaped solder bumps according to claim 1 further comprising the step of providing said electrically insulating material layer in a polymeric-based adhesive.

10. A method for forming a flip chip package by cone-shaped solder bumps according to claim 1 further comprising the step of providing said electrically insulating material layer in an adhesive material that is electrically insulative.

11. A method for forming a flip chip package by cone-shaped solder bumps according to claim 1 further comprising the step of providing said electrically insulating material layer in an adhesive material that is electrically insulative in a laminate that has an electrically insulating core material sandwiched between two layers of electrically insulating adhesive material.

12. A method for forming a flip chip package by cone-shaped solder bumps according to claim 11, wherein said electrically insulating core material is selected from the group consisting of liquid crystal polymers, polyimide, epoxy and polyaramid, said electrically insulating adhesive material is selected from the group consisting of epoxy, polyimide and polyester.

13. A method for forming a flip chip package by cone-shaped solder bumps according to claim 1 further comprising the step of compressing said IC chip and said substrate together at a temperature between about 150° C. and about 300° C.

14. A method for forming a flip chip package by cone-shaped solder bumps according to claim 1 further comprising the step of compressing said IC chip and said substrate together at a pressure between about 50 psi and about 200 psi.

* * * * *